(12) United States Patent
Zhang et al.

(10) Patent No.: US 9,929,381 B2
(45) Date of Patent: Mar. 27, 2018

(54) PACKAGING EQUIPMENT, METHOD FOR USING THE SAME, AND COMPUTER READABLE STORAGE MEDIUM

(71) Applicant: BOE Technology Group Co., Ltd., Beijing (CN)

(72) Inventors: Xiaolei Zhang, Beijing (CN); Seiji Fujino, Beijing (CN); Wei Cui, Beijing (CN); Xiaohu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/320,575

(22) PCT Filed: Apr. 15, 2016

(86) PCT No.: PCT/CN2016/079462
§ 371 (c)(1),
(2) Date: Dec. 20, 2016

(87) PCT Pub. No.: WO2016/197703
PCT Pub. Date: Dec. 15, 2016

(65) Prior Publication Data
US 2017/0200921 A1 Jul. 13, 2017

(30) Foreign Application Priority Data
Jun. 11, 2015 (CN) .......................... 2015 1 0320223

(51) Int. Cl.
*H01L 51/56* (2006.01)
*H01L 51/52* (2006.01)
(Continued)

(52) U.S. Cl.
CPC ............ *H01L 51/56* (2013.01); *B65B 65/003* (2013.01); *B65B 65/02* (2013.01); *G06K 9/32* (2013.01);
(Continued)

(58) Field of Classification Search
CPC ......... H01L 2924/0002; H01L 2924/00; H01L 23/576; H01L 21/78; H01L 21/67092
See application file for complete search history.

(56) References Cited

U.S. PATENT DOCUMENTS

2004/0002199 A1* 1/2004 Fukuyo .............. B23K 26/0057
438/460
2004/0239853 A1 12/2004 Sakurada

FOREIGN PATENT DOCUMENTS

CN 102107241 A 6/2011
CN 102368130 A 3/2012
(Continued)

OTHER PUBLICATIONS

Jul. 25, 2016—(WO) International Search Report and Written Opinion Appn PCT/CN2016/079462 with English Tran.
(Continued)

*Primary Examiner* — Tony Tran
(74) *Attorney, Agent, or Firm* — Banner & Witcoff, Ltd.

(57) ABSTRACT

Discloses is a packaging equipment, a method for using the same, and a computer readable storage medium. The packaging equipment includes a movable mechanism and a package assembly, and the movable mechanism is configured to drive the package assembly to move along a predetermined path. The package assembly includes a first rotating mechanism and a first functional module disposed along a first axis, a second functional module is disposed on the first rotating mechanism, and the first rotating mechanism is configured to drive the second functional module to rotate around the first axis.

3 Claims, 6 Drawing Sheets

(51) Int. Cl.
    *H01L 21/67*     (2006.01)
    *G06K 9/32*     (2006.01)
    *B65B 65/02*     (2006.01)
    *B65B 65/00*     (2006.01)

(52) U.S. Cl.
    CPC .. *H01L 21/67115* (2013.01); *H01L 21/67126* (2013.01); *H01L 21/67259* (2013.01); *H01L 51/5253* (2013.01)

(56) References Cited

FOREIGN PATENT DOCUMENTS

| | | |
|---|---|---|
| CN | 202815380 U | 3/2013 |
| CN | 203124215 U | 8/2013 |
| CN | 203264995 U | 11/2013 |
| CN | 204340283 U | 5/2015 |
| CN | 204353048 U | 5/2015 |
| CN | 105098098 A | 11/2015 |
| JP | H118499 A | 1/1999 |

OTHER PUBLICATIONS

Sep. 26, 2016—(CN) First Office Action Appn 201510320223.0 with English Tran.

\* cited by examiner

PACKAGING EQUIPMENT, METHOD FOR USING THE SAME, AND COMPUTER READABLE STORAGE MEDIUM

The application is a U.S. National Phase Entry of International Application No. PCT/CN2016/079462 filed on Apr. 15, 2016, designating the United States of America and claiming priority to Chinese Patent Application No. 201510320223.0, filed on Jun. 11, 2015. The present application claims priority to and the benefit of the above-identified applications and the above-identified applications are incorporated by reference herein in their entirety.

FIELD OF THE ART

Embodiments of the disclosed herein relate to a packaging equipment, a method for using the same, and a computer readable storage medium.

BACKGROUND

Organic Light Emitting Diode (OLED) displays are widely used on a variety of electronic products due to its many advantages, such as all-solid state, self-luminous, high resolution, high brightness, high luminous efficiency, fast response, wide operating temperature range, low driving voltage, low power consumption, etc. However, organic light emitting components in OLED displays are vulnerable to oxygen and water vapor, and a reason that the OLED life span is short is the oxidative damage caused by the combination of the organic light emitting components and oxygen or water vapor. In this case, packaging processes are necessary for the OLED life span.

SUMMARY

Embodiments of the disclosed herein provide a packaging equipment, a method for using the same, and a computer readable storage medium. According to at least one embodiment of the disclosed herein, a packaging equipment is provided. The packaging equipment comprises a movable mechanism and a package assembly, and the movable mechanism is configured to drive the package assembly to move along a predetermined path. The package assembly comprises a first rotating mechanism and a first functional module disposed along a first axis, a second functional module is disposed on the first rotating mechanism, and the first rotating mechanism is configured to drive the second functional module to rotate around the first axis.

As a possible implementation, the packaging equipment further comprises a second rotating mechanism, a third functional module is disposed on the second rotating mechanism, and the second rotating mechanism is configured to drive the third functional module to rotate around the first axis.

As a possible implementation, the first rotating mechanism comprises a first motor, an output shaft of the first motor is fixed to a first driving gear, the first driving gear is engaged with a first driven gear, an axis of the first driven gear overlaps with the first axis, and the second functional module is fixed relative to the first driven gear.

The second rotating mechanism comprises a second motor, an output shaft of the second motor is fixed to a second driving gear, the second driving gear is engaged with a second driven gear, an axis of the second driven gear overlaps with the first axis, and the third functional module is fixed relative to the second driven gear.

As a possible implementation, the packaging equipment further comprises a controller, and the controller is configured to control the first rotating mechanism and the second rotating mechanism to rotate.

As a possible implementation, the packaging equipment further comprises a limit sensor, and the limit sensor is configured to send a prompt signal to the controller in condition that a distance between the second functional module and the third functional module is smaller than a predetermined distance.

As a possible implementation, the first functional module is an adhesive line coating device, and the second functional module or the third functional module is a detecting device. The controller is configured to receive a feedback signal from the detecting device and control a rotation angle and a rotation speed of both the first rotating mechanism and the second rotating mechanism according to the feedback signal.

As an embodiment of the disclosed herein, the adhesive line coating device is an adhesive line coating head, and the detecting device is a CCD camera.

As a possible implementation, the movable mechanism is configured to drive the package assembly to move along a direction vertical to a surface of a component to be packaged, and the first functional module is an adhesive line coating device. The second functional module or the third functional module is a laser distance measuring device. The laser distance measuring device is configured to measure a distance between an adhesive line on the surface of the component to be packaged and the adhesive line coating device and send the measured distance to the controller. The controller is configured to control the movable mechanism to drive the package assembly to move along the direction vertical to the surface of the component to be packaged according to the measured distance.

As a possible implementation, the first functional module is a CCD camera, the second functional module is a low energy laser cutting head, the third functional module is a high energy laser cutting head, and the controller is configured to receive a feedback signal from the CCD camera and control the rotation angle and the rotation speed of both the first rotating mechanism and the second rotating mechanism according to the feedback signal.

According to at least one embodiment of the disclosed herein, a method of using the provided packaging equipment is provided, and the method comprises the following steps:

starting the movable mechanism such that the movable mechanism drives the package assembly to move along a predetermined path and the adhesive line coating device coats the adhesive line along the predetermined path; and controlling the first rotating mechanism or the second rotating mechanism to rotate such that the coated adhesive line is kept within a visual field of the detecting device.

As an example, the adhesive line coating device is an adhesive line coating head and the detecting device is a CCD camera.

As an example, the step of controlling the first rotating mechanism or the second rotating mechanism to rotate such that the coated adhesive line is kept within the visual field of the CCD camera comprises:

at the same time of the movement of the package assembly, detecting, by the CCD camera, whether a center line extending along a length direction of the adhesive line coated by the adhesive line coating head overlaps with a center of visual field of the CCD camera synchronously, and in condition of overlapping, keeping the movement in a current state, in condition of no overlapping, sends a feedback signal by the CCD camera to the controller to allow the controller to control the rotating mechanism corresponding to the CCD camera to drive the CCD camera to rotate around the first axis such that the center of the visual field of the CCD camera overlaps with the center line extending along the length direction of the adhesive line.

As an example, the step of detecting by the CCD camera whether the center line extending along the length direction of the adhesive line coated by the adhesive line coating head overlaps with the center of view of the CCD camera synchronously comprises:

at the same time of the movement of the package assembly, detecting, by the CCD camera, respective vertical distances from two side edges of the adhesive line to the center of the visual field of the CCD camera synchronously, in condition that the vertical distances from the two side edges of the adhesive line to the center of the visual field of the CCD camera are equal to each other, the center line extending along the length direction of the adhesive line is overlapping with the center of the visual field of the CCD camera, in condition that the vertical distances from the two side edges of the adhesive line to the center of the visual field of the CCD camera are different, the center line extending along the length direction of the adhesive line is non-overlapping with the center of the visual field of the CCD camera.

According to an embodiment of the disclosed herein, a method of using the packaging equipment is provided. The method comprises the following steps:

starting the movable mechanism such that the movable mechanism drives the package assembly to move along a predetermined path, and the adhesive line coating device coats the adhesive line along the predetermined path; and at the same time of the movement of the package assembly, detecting, by the detecting device, a distance between the adhesive line coated by an adhesive line coating head and a panel region synchronously, and sending a feedback signal, by the detecting device, to the controller to allow the controller to trigger an alarm in condition that the distance between the adhesive line and the panel region deviates from a predetermined value.

According to an embodiment of the disclosed herein, a method of using the packaging equipment is provided. The method comprises the following steps:

starting the movable mechanism such that the movable mechanism drives the package assembly to move along a predetermined path and the adhesive line coating device coats the adhesive line along the predetermined path; and at the same time of the movement of the package assembly, measuring, by the laser distance measuring device, a distance between the adhesive line on the surface of the component to be packaged and an adhesive line coating head synchronously, and sending a measured distance to the controller, in condition that the measured distance is identical with a predetermined value, keeping the movement in a current state, and in condition that the measured distance is non-identical with the predetermined value, controlling the movable mechanism by the controller to drive the package assembly to move along the direction vertical to the surface of the component to be packaged such that the distance between the adhesive line on the surface of the component to be packaged and the adhesive line coating head is equal to the predetermined value.

According to an embodiment of the disclosed herein, a method of using the packaging equipment is provided. The method comprises the following steps:

starting the movable mechanism such that the movable mechanism drives the package assembly to move along a predetermined cutting path, which allows the low energy laser cutting head to cut a flexible film of a display and allows the high energy laser cutting head to cut an exposed substrate;

controlling the first rotating mechanism or the second rotating mechanism to rotate, such that cutting paths of the low energy laser cutting head and the high energy laser cutting head overlap with the predetermined cutting path all the time; and at the same time of the movement of the package assembly, detecting, by the CCD camera, whether the actual cutting paths of the low energy laser cutting head and the high energy laser cutting head overlap with the predetermined cutting path synchronously, and sending a feedback signal to the controller to allow the controller to trigger an alarm if the actual cutting paths do not overlap with the predetermined cutting path.

According to at least one embodiment of the disclosed herein, a computer readable storage medium is provided. The computer readable storage medium comprises instructions for controlling a packaging equipment, wherein the packaging equipment comprises a movable mechanism and a package assembly, the package assembly comprises a first rotating mechanism, an adhesive line coating device disposed along a first axis and a second rotating mechanism, and a detecting device disposed on the first rotating mechanism, and the instructions comprise:

an instruction to start the movable mechanism, allowing the movable mechanism to drive the package assembly to move along a predetermined path, and the adhesive line coating device to coat adhesive line along the predetermined path; and a control instruction controlling the first rotating mechanism and the second rotating mechanism such that the coated adhesive line is kept within a detecting range of the detecting device.

BRIEF DESCRIPTION OF THE DRAWINGS

In order to clearly illustrate the technical solution of the embodiments of the disclosed herein for a person having ordinary skill in the art, the embodiments will be described in details with references to the following drawings.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
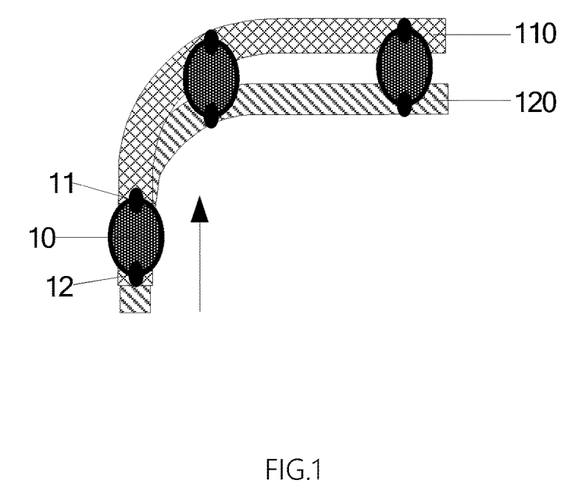
FIG. 1 schematically illustrates moving paths of two functional modules of a packaging equipment.

The inventor has found that a plurality of functional modules of a packaging equipment is required to complete the packaging process together. As an example, during a process of coating an adhesive line, an adhesive coating module and a detecting module are employed together to complete the process. However, in a packaging equipment as illustrated in FIG. 1, a plurality of functional modules are fixed relative to each other. In this case, the functional modules of the packaging equipment can only cooperate with each other in a single direction during the packaging process. As illustrated in FIG. 1, when a packaging equipment 10 is moving in a first direction (the direction of the arrow in the drawing), a moving path of an adhesive coating module 11 overlaps with a moving path of monitoring module 12, thus the monitoring module 12 can monitor the adhesive line coated by the adhesive line coating module 11 in real time. When the moving direction of the packaging equipment 10 changes, a moving path 110 of the adhesive coating module 11 does not overlap with a moving path 120 of the monitoring module 12 any longer, thus the monitoring module 12 can no longer monitor the adhesive line coated by the adhesive line coating module 11. Due to the above fact, the functional modules in this type of packaging equipment can only cooperate with each other in a single direction during the packaging process but cannot meet the requirement of diversified packaging.

Figure 2:
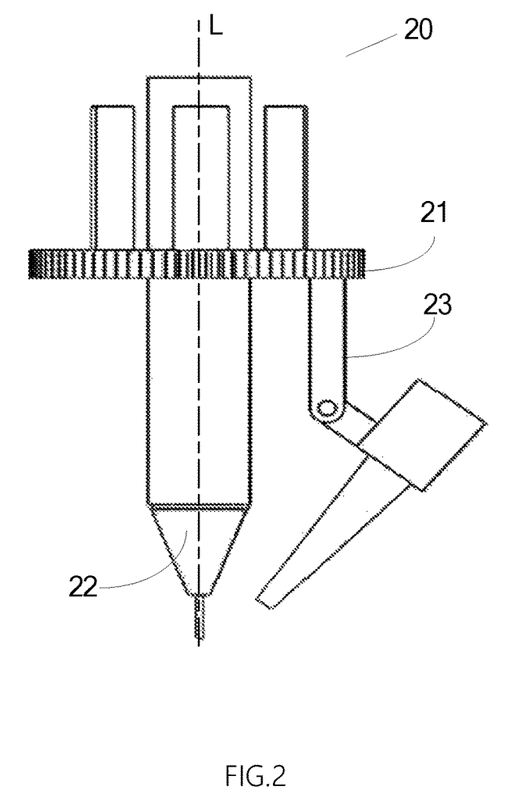
FIG. 2 schematically illustrates a packaging equipment in accordance with an embodiment of the disclosed herein.

An embodiment of the disclosed herein provides a packaging equipment. As illustrated in FIG. 2, the packaging equipment comprises a movable mechanism (not shown in the drawing) and a package assembly 20. The movable mechanism is configured to drive the package assembly 20 to move along a predetermined path. The package assembly 20 comprises a first rotating mechanism 21 and a first functional module 22 disposed along a first axis L, a second functional module 23 is disposed on the first rotating mechanism 21, and the first rotating mechanism 21 is configured to drive the second functional module 23 to rotate around the first axis L.

In the packaging equipment provided by the embodiment of the disclosed herein, when the movable mechanism drives the package assembly to move, the first rotate mechanism can drive the second functional module to rotate such that the second functional module moves along the predetermined path as well. Due to the above fact, the functional modules of the provided packaging equipment can cooperate with each other in any direction for packaging, thereby meeting the requirements of diversified packaging.

Figure 3:
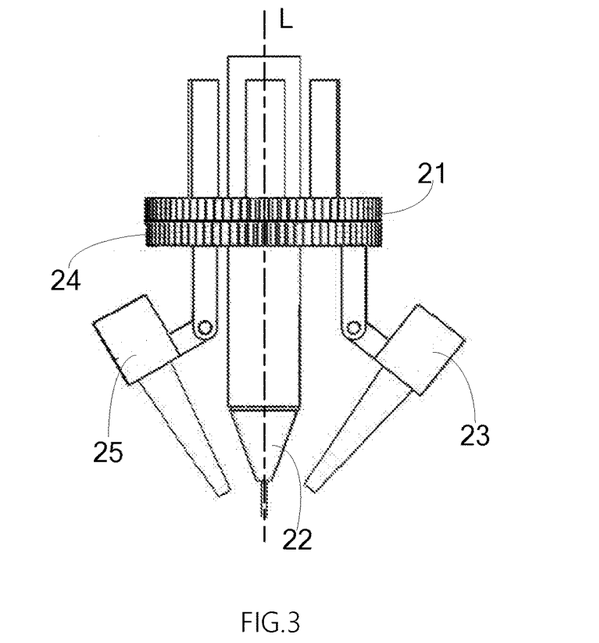
FIG. 3 schematically illustrates another packaging equipment in accordance with an embodiment of the disclosed herein.

As an example illustrated in FIG. 3, the packaging equipment further comprises a second rotate mechanism 24, a third functional module 25 is disposed on the second rotate mechanism 24, and the second rotating mechanism 24 is configured to drive the third functional module 25 to rotate around the first axis.

The packaging equipment provided by the embodiment of the disclosed herein can allow the first functional module, the second functional module and the third functional module to move along the predetermined paths simultaneously, thereby making it possible to use three functional modules for packaging simultaneously and increasing the packaging efficiency of the packaging equipment.

It is noted that, the embodiment of the disclosed herein is only described with reference to an exemplary packaging equipment comprising three functional modules. However, more functional modules may be included in the embodiment of the disclosed herein. When more than three of functional modules are included in the packaging equipment, each of the functional modules is fixed to a rotating mechanism rotatable around the first axis. However, it is not limitative to the embodiment of the disclosed herein.

Figure 4:
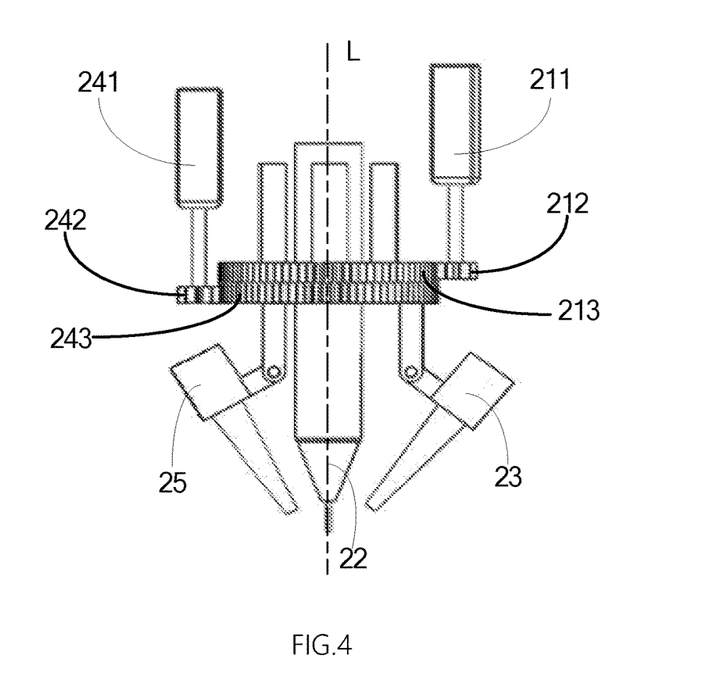
FIG. 4 schematically illustrates still another packaging equipment in accordance with an embodiment of the disclosed herein.

Exemplarily, as illustrated in FIG. 4, the first rotating mechanism 21 comprises a first motor 211. An output shaft of the first motor is fixed to a first driving gear 212, and the first driving gear 212 is engaged with a first driven gear 213. An axis of the first driven gear 213 overlaps with the first axis L. The second functional module 23 is fixed relative to the first driven gear 213.

The second rotating mechanism 24 comprises a second motor 241. An output shaft of the second motor 241 is fixed to a second driving gear 242, and the second driving gear 242 is engaged with a second driven gear 243. An axis of the second driven gear 243 overlaps with the first axis L. The third functional module 25 is fixed relative to the second driven gear 243.

When the first motor is started, the first motor can drive the first driving gear fixed on the output shaft of the first motor, then the first driving gear drivers the first driven gear engaged with the first driving gear. Moreover, the second functional module is fixed relative to the first driven gear, that is, the first motor can drive the second functional module to rotate around the first axis when being started. Similarly, when the second motor is started, the second motor can drive the second driving gear fixed on the output shaft of the second motor, then the second driving gear drivers the second driven gear engaged with the second driving gear. Moreover, the third functional module is fixed relative to the second driven gear, that is, the second motor can drive the third functional module to rotate around the first axis when being started.

Figure 5:
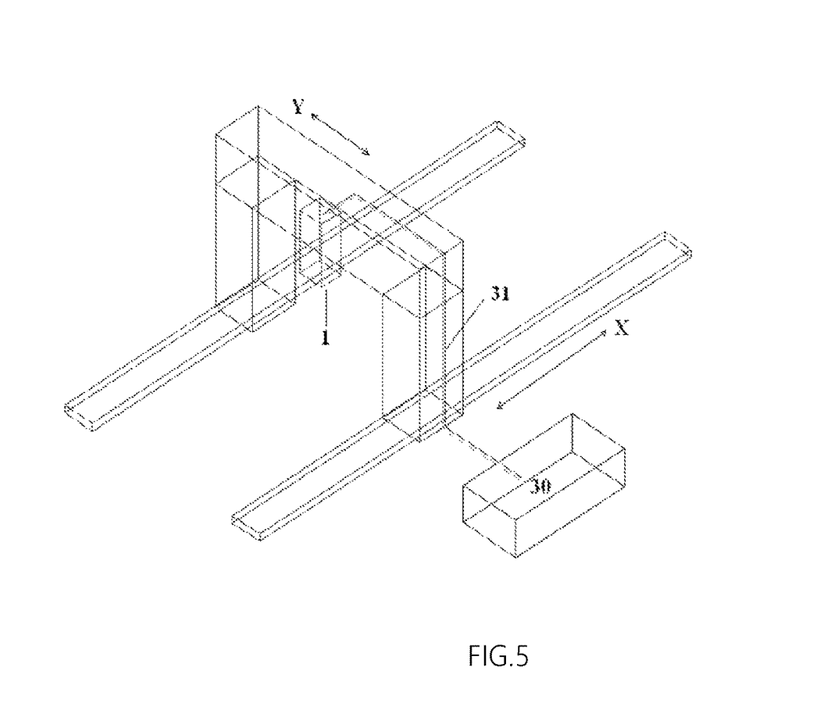
FIG. 5 illustrates a schematic functional diagram of a packaging equipment in accordance with an embodiment of the disclosed herein.

Exemplarily, as illustrated in FIG. 5, the packaging equipment further comprises: a controller 30. The controller 30 may be connected to a multi-functional composite synchronization mechanism 1 through a control cable 31 such that the packaging equipment may move along the X direction and the Y direction.

As an example, the controller 30 controls the first rotate mechanism 21 and the second rotating mechanism 24 to rotate. Through controlling the first rotate mechanism 21 and the second rotating mechanism 24 to rotate by the controller, that is, controlling the moving paths of the second functional module 23 and the third functional module 25 by the first controller, it can further realize automation and intellectualization of the packaging equipment.

As an example, when the packaging equipment in the embodiment of the disclosed herein comprises the third functional module, the packaging equipment may further comprise: a limit sensor. The limit sensor can send a prompt signal to the controller 30 when a distance between the second functional module and the third functional module is smaller than a predetermined distance.

As an example, when the movable rotating modules are close to each other to a certain distance, the limit sensor triggers an alarm to prevent the two modules from colliding with each other.

The limit sensor can send a prompt signal to the controller 30 when a distance between the second functional module and the third functional module is smaller than a predetermined distance, thereby preventing the second functional module and the third functional module from colliding with each other.

Furthermore, when the packaging equipment in the embodiment of the disclosed herein comprises more functional modules, the limit sensor can monitor distances between multiple functional modules, and send a prompt signal when the distances are less than the predetermined value to prevent the multiple functional modules from colliding with each other.

In the following, the operation process of the packaging equipment in the embodiment of the disclosed herein will be described in detail with reference to an example having functional modules of an adhesive line coating head, a CCD camera, a laser distance measuring device, a low energy laser cutting head, a high energy laser cutting head.

The first possible implementation:

The first functional module of the packaging equipment is an adhesive line coating device such as an adhesive line coating head. The second functional module or the third functional module is a detecting device such as a CCD camera. The controller receives a feedback signal from the CCD camera and controls the rotation angle and the rotation speed of both the first rotating mechanism and the second rotating mechanism according to the feedback signal.

Figure 6:
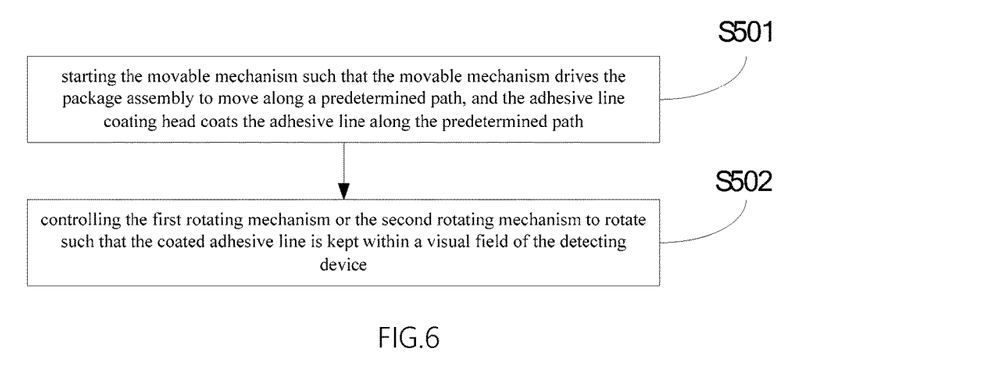
FIG. 6 schematically illustrates a flow chart of steps of a method of using a packaging equipment in accordance with an embodiment of the disclosed herein.

As illustrated in FIG. 6, when the first functional module of the packaging equipment is a adhesive line coating head and the second functional module or the third functional module is a detecting device such as a CCD camera, a first method of using the packaging equipment comprises the following steps:

S501: starting the movable mechanism such that the movable mechanism drives the package assembly to move along a predetermined path, and the adhesive line coating head coats the adhesive line along the predetermined path.

S502: controlling the first rotating mechanism or the second rotating mechanism to rotate such that the coated adhesive line is kept within a visual field of the detecting device.

As an example, the step S502 of controlling the first rotating mechanism or the second rotating mechanism to rotate such that the coated adhesive line is kept within the visual field of the detecting device comprises:

at the same time of the movement of the package assembly, the CCD camera detects whether the center line extending along a length direction of the adhesive line coated by the adhesive line coating head overlaps with the center of view of the CCD camera synchronously; and if they overlap, the movement continues under the current state; if they do not overlap, the CCD camera sends a feedback signal to the controller, and the controller controls the rotating mechanism corresponding to the CCD camera to rotate around the first axis, such that the CCD camera rotates together with the rotating mechanism and the center of the visual field of the CCD camera overlaps with the center line extending along the length direction of the adhesive line.

As an example, a following method may be employed to determine whether the center of visual field of the CCD camera overlaps with the center line extending along a length direction:

detecting, by the CCD camera, respective vertical distances between two side edges of the adhesive line and the center of the visual field of the CCD camera synchronously, if the vertical distances between the two side edges of the adhesive line and the center of the visual field of the CCD camera are equal to each other, the center line extending along the length direction of the adhesive line overlaps with the center of the visual field of the CCD camera; if the vertical distances between the two side edges of the adhesive line and the center of the visual field of the CCD camera are different, the center line extending along the length direction of the adhesive line does not overlap with the center of the visual field of the CCD camera.

Figure 7:
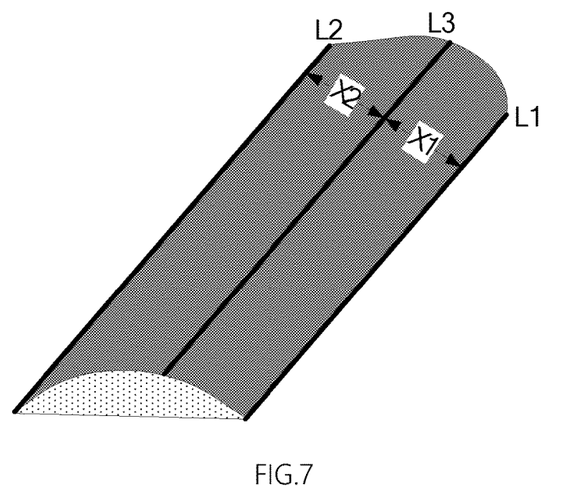
FIG. 7 schematically illustrates distances between two side edges of an adhesive line and the center of a visual field of a CCD camera in accordance with an embodiment of the disclosed herein.

As an example illustrated in FIG. 7, L1 and L2 are two side edges of the adhesive line respectively, L3 is the center of the visual field of the CCD camera, X1 is a distance between L1 and L3, and X2 is a distance between L2 and L3. When X1 is equal to X2, it means that the vertical distances between the center of the visual field of the CCD camera and the two side edges of the adhesive line are equal to each other, and there is no need to rotate the CCD camera. When X1 is larger than X2, it means that the vertical distances between the center of the visual field of the CCD camera and the two side edges of the adhesive line are not equal to each other, and the CCD camera needs to be rotated to the L2 side. When X1 is smaller than the X2, it means that the vertical distances between the center of the visual field of the CCD camera and the two side edges of the adhesive line are not equal to each other, and the CCD camera needs to be rotated to the L1 side.

The CCD camera in the embodiment of the disclosed herein can detect respective vertical distances between two side edges of the adhesive line and the center of the visual field of the CCD camera synchronously, and obtain a width of the adhesive line coated by the adhesive line coating head.

When the adhesive line coated is too wide or too thin, the CCD camera sends a feedback signal to the controller to allow the controller to trigger an alarm. Due to the above fact, the packaging equipment in the embodiment of the disclosed herein can detecting whether the width of the adhesive line qualifies or not while the adhesive line is being coated. The term "qualifies" refers to that the width of the adhesive line coated is within a predetermined range.

As an example, it can create a coordinate system in the embodiment of the disclosed herein such that the adhesive line coated is located in the coordinate system. In this case, it can locate the corresponding position directly according to the coordinate system during subsequent examination and supplementary adhesive coating, which is advantageous to the subsequent examination and supplementary adhesive coating.

Figure 8:
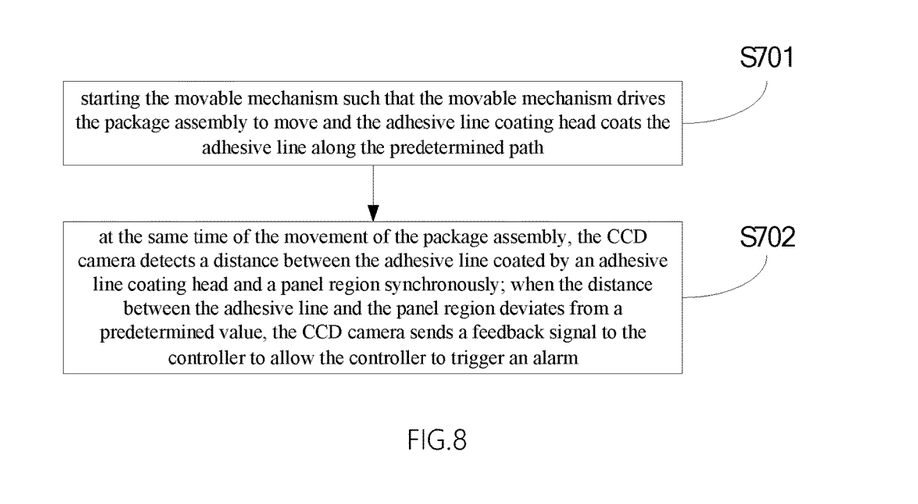
FIG. 8 schematically illustrates a flow chart of steps of another method of using a packaging equipment in accordance with an embodiment of the disclosed herein.

As illustrated in FIG. 8, in case that the first functional module is a adhesive line coating head, the second functional module or the third functional module is a CCD camera, the second method of using the packaging equipment comprises the following steps:

S701: starting the movable mechanism such that the movable mechanism drives the package assembly to move and the adhesive line coating head coats the adhesive line along the predetermined path.

S702: at the same time of the movement of the package assembly, the CCD camera detects a distance between the adhesive line coated by an adhesive line coating head and a panel region synchronously; when the distance between the adhesive line and the panel region deviates from a predetermined value, the CCD camera sends a feedback signal to the controller to allow the controller to trigger an alarm.

Figure 9:
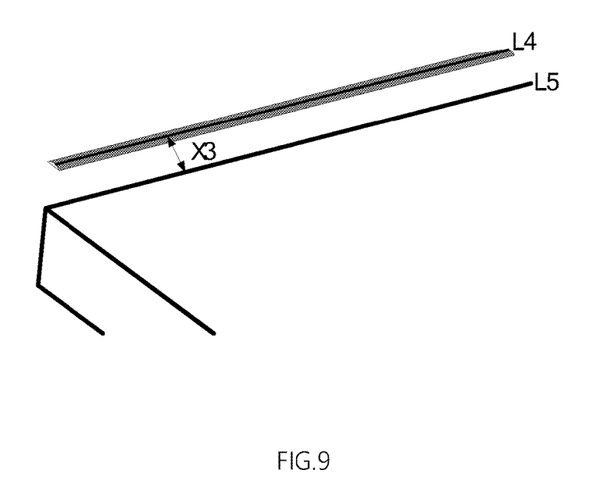
FIG. 9 schematically illustrates a distance between an adhesive line and an edge of a display panel in accordance with an embodiment of the disclosed herein.

As an example illustrated in FIG. 9, L4 is the center line of the adhesive line, L5 is an edge of the display panel, and X3 is a vertical distance between L4 and L5. The CCD camera detects in real time whether the vertical distance between L4 and L5 is equal to X3 or is within a predetermined range. When the vertical distance is not equal to X3 or out of the predetermined range, the CCD camera sends a feedback signal to the controller 30 and allows the controller 30 to trigger an alarm. The predetermined range refers to that the difference value between the vertical distance and X3 is within a certain range.

In the above embodiment of the disclosed herein, the CCD camera detects the distance between the adhesive line coated by the adhesive line coating head and the panel region synchronously, and sends a feedback signal to the controller to allow the controller to trigger an alarm when the distance between the adhesive line and the panel region deviates from a predetermined value. In this case, the packaging equipment in the embodiment of the disclosed herein can detect whether the position of the adhesive line coated is qualified while the adhesive line is being coated. The term "qualified" refers to that the position of the adhesive line coated is within a predetermined range.

The packaging equipment in the embodiment of the disclosed herein can coat the adhesive line on shapes such as a circle, a rhombus, a rectangle and an arbitrary curve, and monitor the process of coating the adhesive line synchronously.

The second possible implementation:

The movable mechanism of the packaging equipment drives the package assembly to move along a direction vertical to a surface of a component to be packaged, the first functional module is a adhesive line coating head, the second functional module or the third functional module is a laser distance measuring device. The laser distance measuring device measures a distance between a adhesive line on the surface of the component to be packaged and the adhesive line coating head and send the measured distance to the controller, and the controller controls the movable mechanism to drive the package assembly to move along the direction vertical to the surface of the component to be packaged according to the measured distance.

Figure 10:
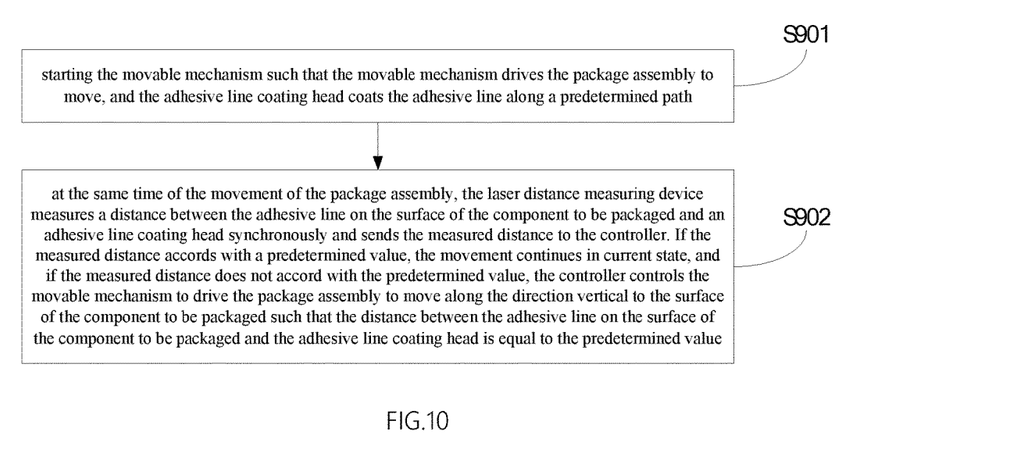
FIG. 10 schematically illustrates a flow chart of still another method of using a packaging equipment in accordance with an embodiment of the disclosed herein.

As illustrated in FIG. 10, when the first functional module is a adhesive line coating head and the second functional module or the third functional module is a laser distance measuring device, the method of using the packaging equipment comprises the following steps:

S901, starting the movable mechanism such that the movable mechanism drives the package assembly to move, and the adhesive line coating head coats the adhesive line along a predetermined path.

S902: at the same time of the movement of the package assembly, the laser distance measuring device measures a distance between the adhesive line on the surface of the component to be packaged and an adhesive line coating head synchronously and sends the measured distance to the controller. If the measured distance accords with a predetermined value, the movement continues in current state, and if the measured distance does not accord with the predetermined value, the controller controls the movable mechanism to drive the package assembly to move along the direction vertical to the surface of the component to be packaged such that the distance between the adhesive line on the surface of the component to be packaged and the adhesive line coating head is equal to the predetermined value.

In the embodiment of the disclosed herein, it can synchronously monitor whether a thickness of the coated adhesive line reaches a predetermined thickness through the adhesive line head and the laser distance measuring device. In this case, it realizes the detecting of the thickness of the coated adhesive line, and allows the packaging equipment to be adapted to nonplanar packaging. Moreover, when the space for coating the adhesive line is very narrow and small which cause a mutual interference between the adhesive line coating head and the laser distance measuring device, it may first use the laser distance measuring device to scan a height and correspond the scanned height to the adhesive line one by one, then coat the adhesive line through the adhesive line coating head.

The third possible implementation:

The first functional module is a CCD camera, the second functional module is a low energy laser cutting head, the third functional module is a high energy laser cutting head, and the controller receives a feedback signal from the CCD camera and controls the rotation angle and the rotation speed of the first rotating mechanism and the second rotating mechanism according to the feedback signal.

Figure 11:
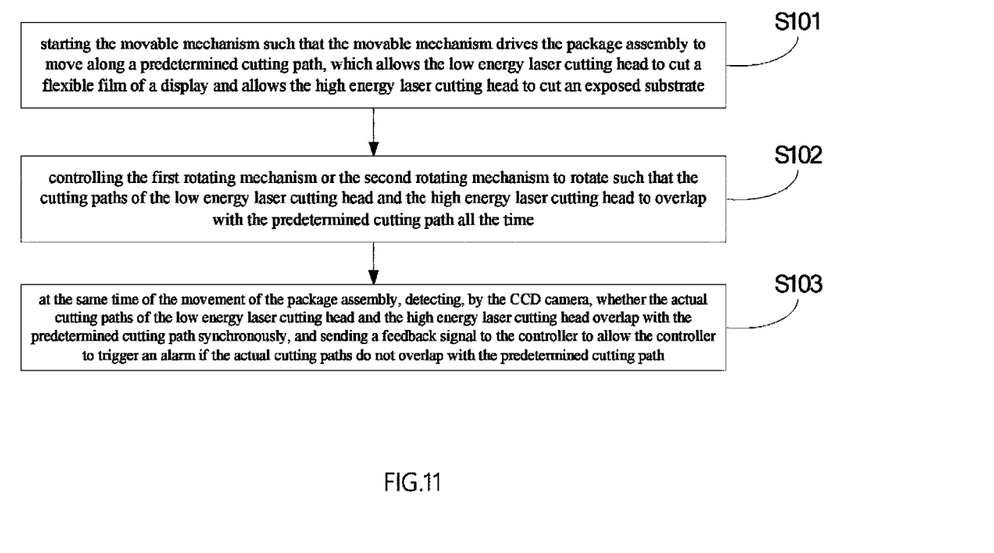
FIG. 11 schematically illustrates a flow chart of yet another method of using a packaging equipment in accordance with an embodiment of the disclosed herein.

As illustrated in FIG. 11, when the first functional module is a CCD camera, the second functional module is a low energy laser cutting head, and the third functional module is a high energy laser cutting head, the method of using the packaging equipment comprises the following steps:

S101: starting the movable mechanism such that the movable mechanism drives the package assembly to move along a predetermined cutting path, which allows the low energy laser cutting head to cut a flexible film of a display and allows the high energy laser cutting head to cut an exposed substrate.

S102: controlling the first rotating mechanism or the second rotating mechanism to rotate such that the cutting paths of the low energy laser cutting head and the high energy laser cutting head to overlap with the predetermined cutting path all the time; and S103: at the same time of the movement of the package assembly, detecting, by the CCD camera, whether the actual cutting paths of the low energy laser cutting head and the high energy laser cutting head overlap with the predetermined cutting path synchronously, and sending a feedback signal to the controller to allow the controller to trigger an alarm if the actual cutting paths do not overlap with the predetermined cutting path.

In the embodiment of the disclosed herein, the process of cutting the display is completed through two cutting processes. First the low energy laser cutting head is employed to cut the flexible film of the display, and then the high energy laser cutting head is employed to cut the exposed substrate. At the same time, the CCD camera synchronously detects whether the actual cutting paths of the low energy laser cutting head and the high energy laser cutting head overlap with the predetermined cutting path. In this case, the accuracy of cutting the display can be guaranteed, and two cutting processes can prevent the flexible film disposed on the upper layer of the substrate from the damage by the high energy laser cutting head. Moreover, it can be understood that, the high energy laser cutting head can cut the exposed substrate, which shows that a cutting width of the low energy laser cutting head is larger than that of the high energy laser cutting head.

On the other hand, in the embodiment of the disclosed herein, it allows the moving path of the high energy laser cutting head to overlap with that of the low energy laser cutting head when the packaging equipment moves along arbitrary direction through rotating the second rotating mechanism to drive the high energy laser cutting head to rotate. The functional modules of the packaging equipment provided by the embodiment of the disclosed herein can cooperate with each other along arbitrary direction to package, thereby meeting the requirements of diversified packaging.

It can be understood by those skilled in the art that all or part of the steps for realizing the method of the embodiment may be completed by a program related hardware. The program may be stored in a computer readable storage medium. The program executes the steps of the method of the embodiment when being executed, and the storage medium comprises: ROM, RAM, disk, optical disk or any medium being capable of storing the program codes.

The packaging equipment provided by the embodiment of the disclosed herein comprises a movable mechanism and a package assembly, and the movable mechanism is configured to drive the package assembly to move along a predetermined path. The package assembly comprises a first rotating mechanism and a first functional module disposed along a first axis, a second functional module is disposed on the first rotating mechanism, and the first rotating mechanism is configured to drive the second functional module to rotate around the first axis. When the movable mechanism drives the package assembly to move, the first rotating mechanism can drive the second functional module to rotate, which allows the second functional module to move along the predetermined path too. The functional modules of the packaging equipment provided by the embodiment of the disclosed herein can cooperate with each other along arbitrary direction to package, thereby meeting the requirements of diversified packaging What is described above is related to the specific embodiments of the disclosure only and not limitative to the scope of the disclosure. Any changes or substitutions readily occur to those skilled in the art within the technical scope of the disclosure are intended to be within the scope of the disclosure.

The present application claims priority from Chinese Application No. 201510320223.0, filed on Jun. 11, 2015, entitled "Packaging Equipment and Method for Using the Same", the disclosure of which is incorporated herein by reference in its entirety.

What is claimed is:

1. A method for using packaging equipment, wherein the packaging equipment comprises:
   a movable mechanism and a package assembly, wherein the movable mechanism is configured to drive the package assembly to move along a predetermined path, wherein the package assembly comprises a first rotating mechanism and a first functional module disposed along a first axis, wherein a second functional module is disposed on the first rotating mechanism, and the first rotating mechanism is configured to drive the second functional module to rotate around the first axis;
   a second rotating mechanism, wherein a third functional module is disposed on the second rotating mechanism, and the second rotating mechanism is configured to drive the third functional module to rotate around the first axis; and
   a controller, wherein the controller is configured to control the first rotating mechanism and the second rotating mechanism to rotate;
   wherein the movable mechanism is configured to drive the package assembly to move along a direction vertical to a surface of a component to be packaged, the first functional module is a CCD camera, the second functional module is a low energy laser cutting head, the third functional module is a high energy laser cutting head, and the controller is configured to receive a feedback signal from the CCD camera and control a rotation angle and a rotation speed of both the first rotating mechanism and the second rotating mechanism according to the feedback signal;
   the method comprising:
   starting the movable mechanism such that the movable mechanism drives the package assembly to move along a predetermined cutting path, which allows the low energy laser cutting head to cut a flexible film of a display and allows the high energy laser cutting head to cut an exposed substrate;
   controlling the first rotating mechanism or the second rotating mechanism to rotate, such that cutting paths of the low energy laser cutting head and the high energy laser cutting head overlap with the predetermined cutting path all of the time; and
   at the same time of the movement of the package assembly, detecting, by the CCD camera, whether actual cutting paths of the low energy laser cutting head and the high energy laser cutting head overlap with the predetermined cutting path synchronously, and sending a feedback signal to the controller to allow the controller to trigger an alarm if the actual cutting paths are non-overlapping with the predetermined cutting path.

2. The method of claim 1, wherein the first rotating mechanism comprises a first motor, an output shaft of the first motor is fixed to a first driving gear, the first driving gear is engaged with a first driven gear, an axis of the first driven gear overlaps with the first axis, the second functional module is fixed relative to the first driven gear, and the second rotating mechanism comprises a second motor, an output shaft of the second motor is fixed to a second driving gear, the second driving gear is engaged with a second driven gear, an axis of the second driven gear overlaps with the first axis, and the third functional module is fixed relative to the second driven gear.

3. The method of claim 1, wherein the packaging equipment further comprises a limit sensor, wherein the limit sensor is configured to send a prompt signal to the controller in condition that a distance between the second functional module and the third functional module is smaller than a predetermined distance.

* * * * *